United States Patent
Izumi

(10) Patent No.: US 8,867,273 B2
(45) Date of Patent: Oct. 21, 2014

(54) NON-VOLATILE SEMICONDUCTOR MEMORY DEVICE AND METHOD OF WRITING DATA THEREIN

(75) Inventor: Tatsuo Izumi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 408 days.

(21) Appl. No.: 13/424,819

(22) Filed: Mar. 20, 2012

(65) Prior Publication Data

US 2013/0077402 A1 Mar. 28, 2013

(30) Foreign Application Priority Data

Sep. 26, 2011 (JP) ................................. 2011-208920

(51) Int. Cl.
*G11C 16/04* (2006.01)
*G11C 16/34* (2006.01)

(52) U.S. Cl.
CPC ........ *G11C 16/0483* (2013.01); *G11C 16/3418* (2013.01); *G11C 16/3454* (2013.01)
USPC ............. 365/185.12; 365/185.17; 365/185.23

(58) Field of Classification Search
CPC ........... G11C 16/0483; G11C 11/5628; G11C 16/10; G11C 16/3427
USPC ........................... 365/185.12, 185.17, 185.23
See application file for complete search history.

(56) References Cited

U.S. PATENT DOCUMENTS

| | | | | |
|---|---|---|---|---|
| 7,054,195 B2 * | 5/2006 | Matsunaga | ............... | 365/185.11 |
| 8,054,684 B2 * | 11/2011 | Gorobets et al. | .......... | 365/185.03 |
| 2005/0105359 A1 * | 5/2005 | Matsunaga | .................... | 365/222 |
| 2006/0209593 A1 * | 9/2006 | Toda | ........................ | 365/185.03 |
| 2008/0205145 A1 * | 8/2008 | Kanno et al. | ............. | 365/185.05 |
| 2009/0207642 A1 * | 8/2009 | Shimano et al. | ................. | 365/72 |
| 2010/0149867 A1 * | 6/2010 | Tanaka et al. | ............ | 365/185.03 |
| 2011/0149651 A1 * | 6/2011 | Gorobets et al. | ......... | 365/185.03 |
| 2012/0113731 A1 * | 5/2012 | Shimano et al. | ......... | 365/189.15 |

FOREIGN PATENT DOCUMENTS

JP  2010-520575  6/2010
WO  WO 2008/109411 A1  9/2008

* cited by examiner

*Primary Examiner* — Tuan T Nguyen
(74) *Attorney, Agent, or Firm* — Oblon, Spivak, McClelland, Maier & Neustadt, L.L.P.

(57) ABSTRACT

A non-volatile semiconductor memory device includes a plurality of cell units and a data writing unit. The cell unit includes first and second select gate transistors and a memory string including a plurality of memory cells. The data writing unit sequentially writes lower page data and upper page data corresponding to the lower page data to a selected memory cell selected in order from one close to the first select gate transistor to the second select gate transistor, and performs a first writing operation of writing the lower page data to the selected memory cell and a second writing operation of writing the upper page data to the selected memory cell after the first writing operation for n (n is an integer equal to or greater than 2) non-selected memory cells which are adjacent to a side of the selected memory cell close to the second select gate transistor.

20 Claims, 5 Drawing Sheets

First Writing Operation
(Writing Of Lower Page Data)

Second Writing Operation
(Writing Of Upper Page Data)

| Word Line | WL0 | WL1 | WL2 | WL3 | ... | WL60 | WL61 | WL62 | WL63 |
|---|---|---|---|---|---|---|---|---|---|
| Lower Page Data | 0 | 1 | 2 | 4 | ... | 118 | 120 | 122 | 124 |
| Upper Page Data | 3 | 5 | 7 | 9 | ... | 123 | 125 | 126 | 127 |

NON-VOLATILE SEMICONDUCTOR MEMORY DEVICE AND METHOD OF WRITING DATA THEREIN

CROSS-REFERENCE TO RELATED APPLICATIONS

This application is based upon and claims the benefit of priority from the prior Japanese Patent Application No. 2011-208920, filed on Sep. 26, 2011, the entire contents of which are incorporated herein by reference.

FIELD

Embodiments described herein relate to a non-volatile semiconductor memory device and a method of writing data therein.

BACKGROUND

Description of the Related Art

A NAND flash memory has been known as a non-volatile semiconductor memory device (EEPROM) which can electrically rewrite data and has a high degree of integration. In the NAND flash memory, a plurality of memory cells are connected in series to each other such that adjacent memory cells share source/drain diffusion layers, thereby forming a NAND cell unit. Both ends of the NAND cell unit are respectively connected to a bit line and a source line through select gate transistors. In the structure of the NAND cell unit, the area of a unit cell is small and it is possible to store a large amount of data, as compared to the structure of a NOR type.

The memory cell of the NAND flash memory includes a semiconductor substrate, a charge storage layer (floating gate) which is formed on the semiconductor substrate with a tunnel insulating film interposed therebetween, and a control gate which is formed on the charge storage layer with an inter-gate insulating film interposed therebetween, and stores data in a non-volatile manner according to the storage state of charges in the floating gate. Specifically, the memory cell stores binary data including data "0" indicating a state in which electrons are injected into the floating gate and a threshold voltage is high and data "1" indicating a state in which electrons are emitted from the floating gate and the threshold voltage is low. In recent years, the distribution of writing threshold values has been subdivided and multi-valued data, such as quaternary data, has been stored.

However, the miniaturization of the flash memory and the subdivision of the distribution of the writing threshold values cause the following problems.

That is, the distance between the memory cells is reduced, which results in strong interference between adjacent cells. This is because it is difficult to scale the cell array in the vertical direction, as compared to scaling in the horizontal direction.

More specifically, the floating gate of the memory cell is capacitively coupled between the control gate (word line) provided on the floating gate and the substrate (channel) provided immediately below the floating gate. When the cell is miniaturized, the capacitance between the floating gate of one memory cell and the floating gate of an adjacent memory cell is relatively increased greater than that between the floating gate, and the control gate and the substrate. Therefore, when a writing operation is performed on a given memory cell, interference occurs between adjacent cells due to the capacitance coupling between the floating gates of the adjacent cells. As a result, the threshold value of the memory cell having data written thereto is likely to be changed.

For the above-mentioned problems, a study on the order of the writing operations performed on the respective memory cells forming a memory string makes it possible to reduce the interference between the cells. However, in recent years, as the memory cells are further miniaturized, the interference between the cells has increased and thus some advanced measures for the increase in the interference are needed.

DETAILED DESCRIPTION

A non-volatile semiconductor memory device according to an embodiment includes a plurality of cell units and a data writing circuit. The cell unit includes first and second select gate transistors and a memory string that is provided between the first and second select gate transistors and includes a plurality of memory cells which store electrically-rewritable data and are connected in series to each other. The data writing unit sequentially writes lower page data and upper page data corresponding to the lower page data to a selected memory cells selected in order from one close to the first select gate transistor to one close to the second select gate transistor, and performs a first writing operation of writing the lower page data to the selected memory cell and a second writing operation of writing the upper page data to the selected memory cell after the first writing operation for n (n is an integer equal to or greater than 2) non-selected memory cells which are adjacent a side of the selected memory cell close to the second select gate transistor.

First Embodiment

[Overall Structure]

Figure 1:
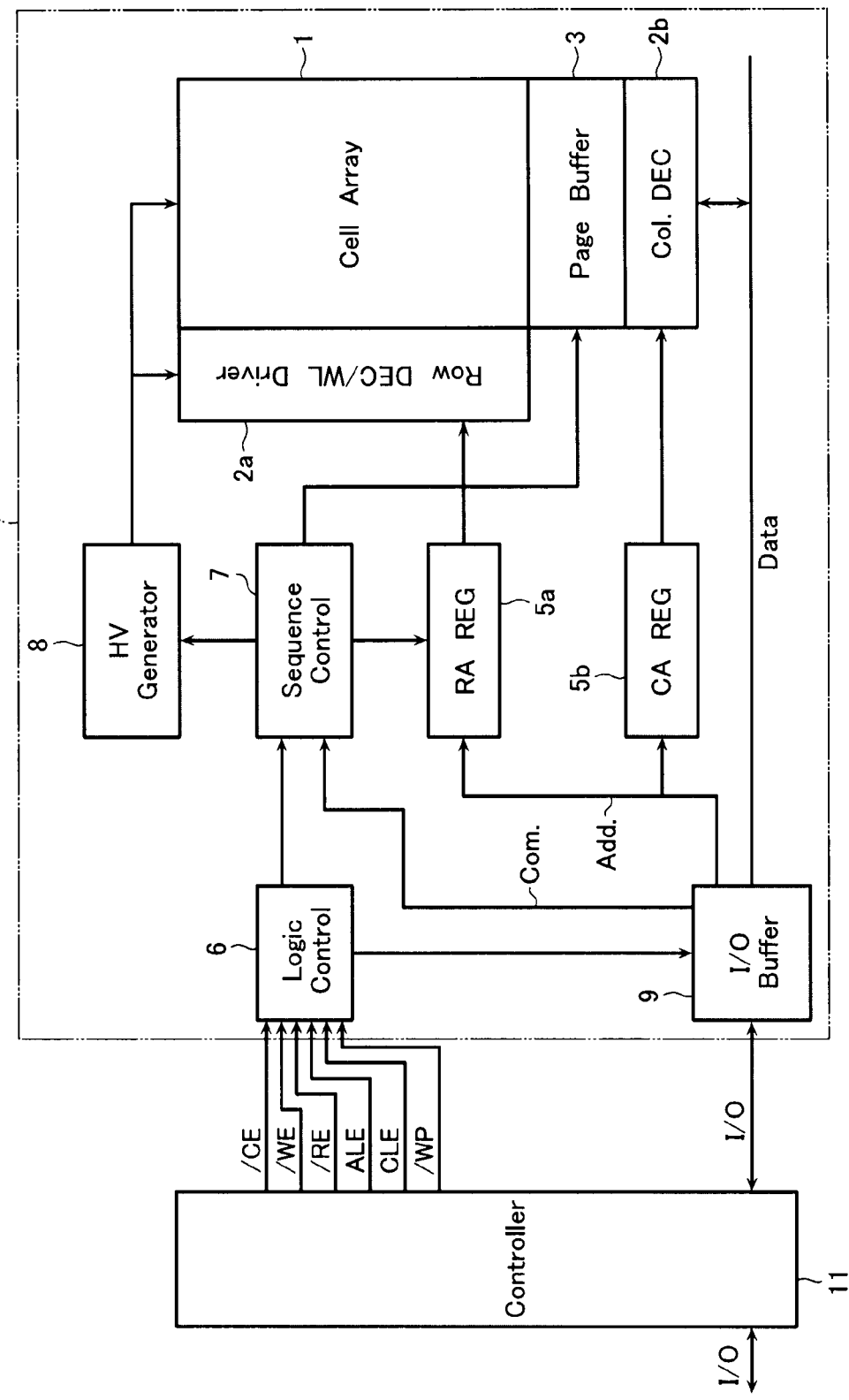
FIG. 1 is a block diagram illustrating the structure of a non-volatile semiconductor memory device according to a first embodiment.

FIG. 1 is a block diagram illustrating the structure of a NAND flash memory according to a first embodiment. The NAND flash memory includes a NAND chip 10 and a controller 11 that controls the NAND chip 10.

A memory cell array 1 configuring the NAND chip 10 includes a plurality of floating gate memory cells MC arranged in a matrix, which will be described below. A row decoder/word line driver 2a, a column decoder 2b, a page buffer 3, and a high voltage generating circuit 8 configure a data writing/reading circuit that writes and read data in a page unit to and from the memory cell array 1. The row decoder/ word line driver 2a drives word lines WL and select gate lines SGD and SGS of the memory cell array 1 illustrated in FIG. 2. The page buffer 3 includes sense amplifier circuits SA (SA0 to SAj-1) and data latch circuits DL (DL0 to DLj-1) corresponding to one page illustrated in FIG. 2, and reads and writes data in a page unit from and to the memory cell array 1.

The column decoder 2b sequentially selects columns of data corresponding one page read from the page buffer 3 and the selected data is output to an external I/O terminal through an I/O buffer 9. Written data supplied from the I/O terminal is selected by the column decoder 2b and is then loaded to the page buffer 3. Written data corresponding to one page is loaded to the page buffer 3. Row and column address signals are input through the I/O buffer 9 and are then transmitted to the row decoder 2a and the column decoder 2b, respectively. A row address register 5a latches an erasing block address in an erasing operation and latches a page address in a writing operation or a reading operation. A first column address for loading written data before a writing operation starts or a first column address for a reading operation is input to a column address register 5b. The column address register 5b latches the input column address until a writing enable signal /WE or a reading enable signal /RE is toggled under a predetermined condition.

The logic control circuit 6 controls the input of commands or addresses and the input/output of data on the basis of control signals, such as a chip enable signal /CE, a command latch enable signal CLE, an address latch enable signal ALE, a writing enable signal /WE, and a reading enable signal /RE. The reading operation or the writing operation is performed by commands. When a command is received, a sequence control circuit 7 controls the sequence of the reading operation, the writing operation, or an erasing operation. A high voltage generating circuit 8 generates a predetermined voltage required for various operations under the control of the control circuit 7.

The controller 11 controls the writing and reading of data under the conditions suitable for the current writing state of the NAND chip 10. A part of reading control may be performed by the NAND chip 10.

[Structure of Cell Array]

Figure 2:
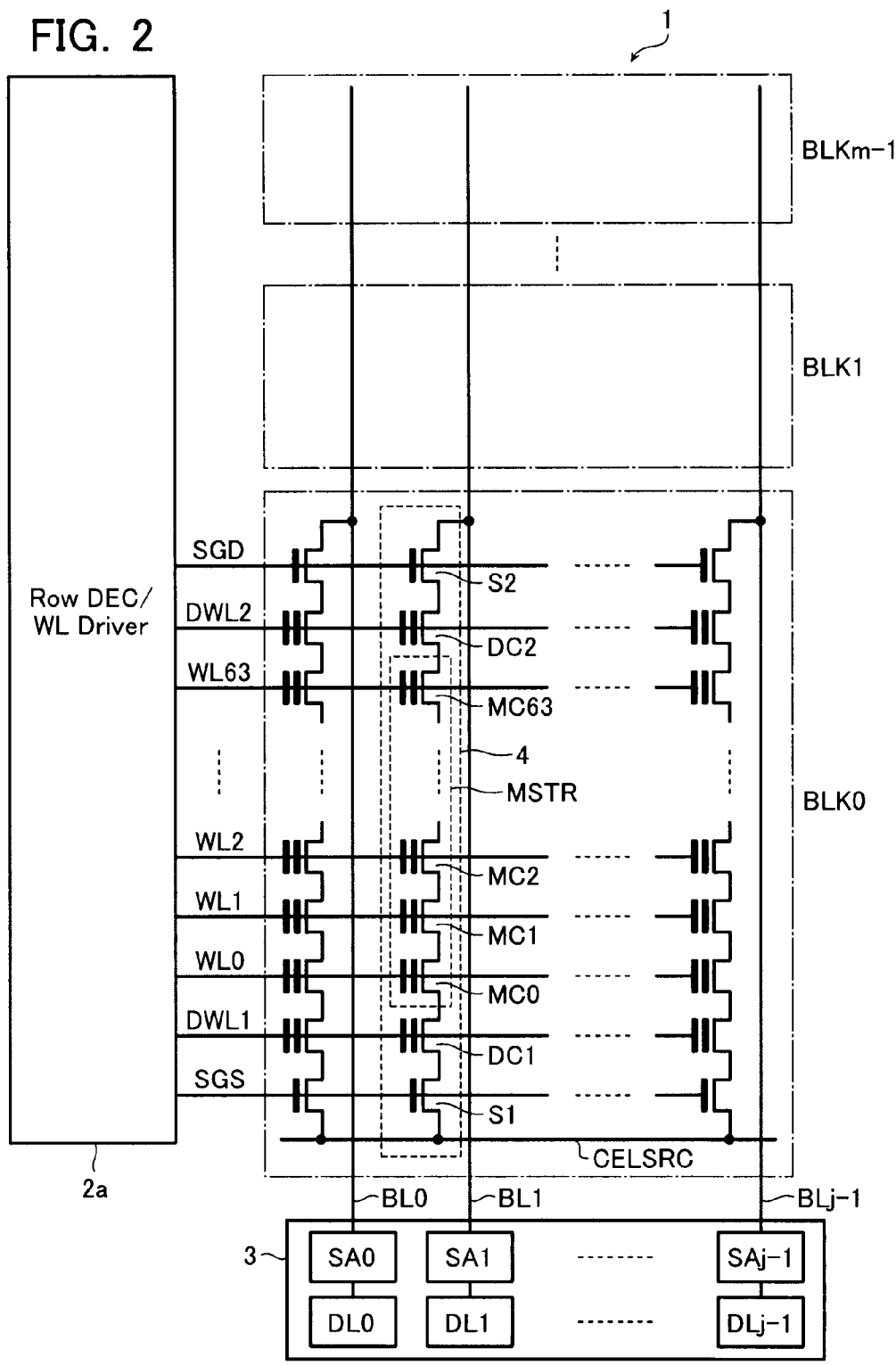
FIG. 2 is a block diagram illustrating an example of the structure of a memory cell array of the non-volatile semiconductor memory device.

FIG. 2 is a block diagram illustrating the detailed structure of the cell array 1. In this example, the cell array 1 includes j NAND cell units 4 (j is a natural number) each having a memory string MSTR including 64 memory cells MC (MC0 to MC63) which are connected in series to each other and select gate transistors S1 and S2 which are connected to both ends of the memory string MSTR. Each of the memory cells MC stores 2-bit (quaternary) data. The source of the select gate transistor S1 is connected to a common source line CELSRC, and the drain of the select gate transistor S2 is connected to a bit line BL (BL0 to BLj-1). The control gates of the memory cells MC0 to MC63 are connected to word lines WL (WL0 to WL63) and the gates of the select gate transistors S1 and S2 are connected to the select gate lines SGS and SGD. As illustrated in FIG. 2, dummy word lines DWL1 and DWL2 having the same structure as the word line WL and dummy cells DC1 and DC2 having the same structure as the memory cell MC may be provided between the memory string MSTR and the select transistors S1 and S2.

A plurality of memory cells MC arranged along one word line WL configures a page, which is the unit of a reading operation and a writing operation. Hereinafter, the page formed by a plurality of memory cells MC arranged along the word line WLi (i=0 to 63) is represented by page<i>. In addition, a plurality of NAND cell units 4 arranged along the word line WL configures a cell block BLK which is the unit of collectively erasing data. In FIG. 2, a plurality of cell blocks BLK0 to BLKm-1 (m is a natural number) sharing the bit lines BL are arranged in the direction of the bit lines BL to configure the cell array 1.

The word lines WL and the select gate lines SGS and SGD are driven by the row decoder 2a. The bit lines BL are connected to sense amplifier circuits SA (SA0 to SAj-1) and data latch circuits DL (DL0 to DLj-1) of the page buffer 3.

[Operation]

Next, the operation of the non-volatile semiconductor memory device according to this embodiment will be described.

Figures 3, 4:
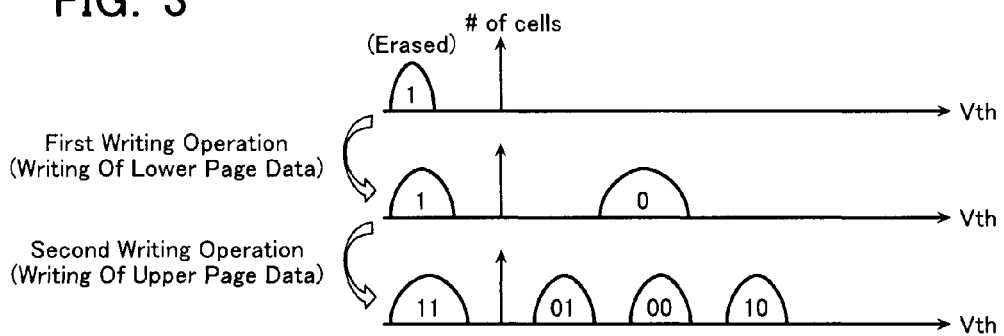
FIG. 3 is histograms illustrating an example of the distribution of threshold values when a writing operation is performed in the non-volatile semiconductor memory device.
FIG. 4 is a diagram illustrating the order in which data is written in the non-volatile semiconductor memory device.

FIG. 3 is histograms illustrating an example of the distribution of the threshold values of the memory cells MC when a data writing operation is performed in the non-volatile semiconductor memory device according to this embodiment.

In a first writing operation, block erasing is performed in advance and the threshold values of all of the memory cells MC in the block have the lowest negative erasing level. This state of the threshold value corresponds to data "1".

As illustrated in FIG. 3, in the first writing operation, lower page data is written. When lower page data "0" is written to the selected memory cell MC, the threshold voltage increases to a lower middle (LM) level. Since the LM level is a threshold value distribution in a roughly written state, noise between adjacent cells (memory cells configuring a page adjacent to the selected page) does not matter. When lower page data "1" is written, the threshold voltage is not moved.

In a second writing operation, upper page data is written. Before the upper page data is written, lower page data is read. When the lower page data is "1" and the upper page data is "1", the threshold level is not moved. When the lower page data is "1" and the upper page data is "0", the threshold level of the memory cell MC at an erasing level is moved to a threshold value distribution level represented by "01". When the lower page data is "0" and the upper page data is "0", the threshold level of the memory cell MC is moved from the LM level to a threshold value distribution level represented by "00". When the lower page data is "0" and the upper page data is "1", the threshold level of the memory cell MC is moved from the LM level to a threshold value distribution level represented by "10".

In this writing system, since the LM level is roughly written in the first writing operation, it is possible to reduce the influence to adjacent cells in the second writing operation. However, when the second writing operation for a memory cell MCi (i is a natural number) ends and the first writing operation is performed on a memory cell MCi+1, the interference to the memory cell MCi occurs due to this writing operation and the threshold value of the memory cell MCi is changed, which causes an operation error. This problem becomes more serious as the size of the memory cell MC is reduced in recent years.

In the non-volatile semiconductor memory device according to this embodiment, the second writing operation is performed on the selected memory cell MCi after both the first writing operation for a first adjacent memory cell MCi+1 adjacent to the selected memory cell MCi and the first writing operation for a second adjacent memory cell MCi+2 adjacent to the adjacent memory cell MCi+1 are finished.

FIG. 4 is a diagram illustrating the order in which data is written in this embodiment. That is, in this embodiment, when the writing operation is performed on a given memory string MSTR, first, the first writing operation is performed on the memory cell MC0 (page <0>) which is connected to the word line WL0 closest to the select gate transistor S1.

Then, similarly, the first writing operation is performed on the memory cells MC1 and MC2 (page <1> and page <2>) connected to the word line WL1 and the word line WL2. When the first writing operation is performed on the page <1>, interference to a plurality of memory cells MC0 configuring the page <0> occurs. When the first writing operation is performed on the page <2>, interference to a plurality of memory cells MC1 and MC0 forming the page <1> and the page <0> occur. As a result, the threshold value of each memory cell MC is changed. However, the change in the threshold value is corrected by the subsequent second writing operation and does not matter.

When the first writing operation for the pages <0>, <1>, and <2> is finished, the second writing operation is performed on the page <0>. In the second writing operation, a reading operation is performed on the selected page <0>, and the threshold level of each selected memory cell MC0 is determined on the basis of the read lower page data and the upper page data to be written to the selected page <0>. Then, the threshold values of each selected memory cell MC0 are increased to the determined threshold level.

As such, since the second writing operation is performed on the selected memory cell MC0 after the first writing operations for the first adjacent page <1> (a page including a plurality of first adjacent memory cells MC1) and the second adjacent page <2> (a page including a plurality of second adjacent memory cells MC2) are finished, the first writing operation can be performed on adjacent pages <1> and <2>, without affecting the distribution of the threshold value of the selected memory cell MC0 in the selected page <0>.

Then, the first writing operation is performed on page <3>. Interference to a plurality of memory cells MC2 and MC1 configuring the page <2> and the page <1> respectively occurs due to the first writing operation and the threshold values of each memory cell MC is changed. However, the changes in the threshold values are corrected by the subsequent second writing operation and do not matter.

Then, the second writing operation is performed on the page <1>. At that time, similarly to the second writing operation for the page <0>, since the first writing operation for the first adjacent page <2> and the second adjacent page <3> has finished, an influence on the distribution of the threshold values of a plurality of selected memory cells MC1 configuring the selected page <1> is small. Interference to a plurality of adjacent memory cells MC0 configuring the adjacent page <0> occurs due to the second writing operation for the selected page <1>. However, since the second writing operation does not require high energy as compared to the first writing operation, the interference to the adjacent cells occurring due to the second writing operation is less than the interference to the adjacent cells occurring due to the first writing operation.

Next, similarly, the first writing operation for a page <i+2> (i is a natural number) and the second writing operation for a page <i> are alternately performed. However, the second writing operation for three pages <61> to page <63> closest to the select gate transistor S2 is continuously performed in this order.

As described above, according to the non-volatile semiconductor memory device according to this embodiment, it is possible to exclude a change in the threshold voltage during the first writing operation.

In this embodiment, the selected memory cell MC to which no data is written has not been described. However, a local self-boosting scheme in which adjacent memory cells MC are cut off may be applied to the selected memory cell MC to which no data is written.

Second Embodiment

Figure 5:
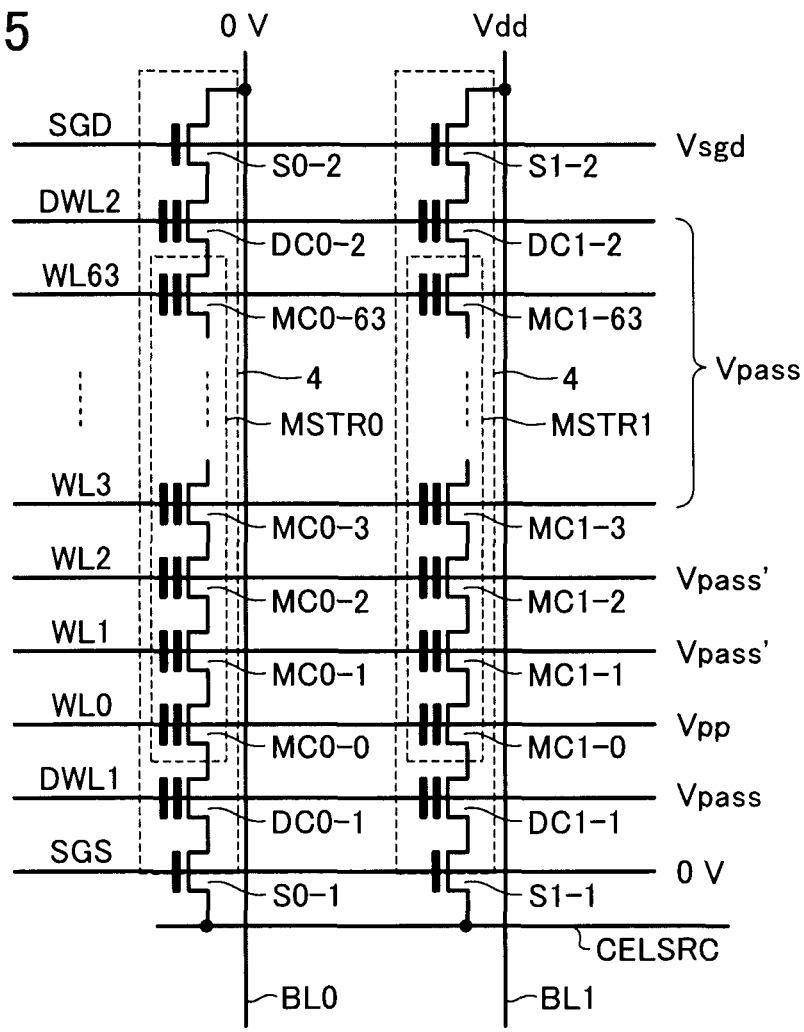
FIG. 5 is a circuit diagram illustrating a voltage applying method when a second writing operation is performed in a non-volatile semiconductor memory device according to a second embodiment.

Next, a non-volatile semiconductor memory device according to a second embodiment will be described. FIG. 5 is a diagram illustrating the application of a voltage in a second writing operation according to this embodiment. In the non-volatile semiconductor memory device according to this embodiment, a voltage application system is improved in the second writing operation when a general self-boosting scheme is used.

As illustrated in FIG. 5, in the second writing operation, first, a voltage Vsgd (=Vdd→<Vdd) is applied to a select gate line SGD and a voltage of 0 V is applied to a select gate line SGS. A voltage of 0 V is applied to a bit line BL0 connected to a selected memory cell MC0-0 to which data "0" is written, and the voltage Vdd is applied to a bit line BL1 connected to a selected memory cell MC1-0 to which data "1" is written (no data is written). Then, a voltage of 0 V is transmitted to the channel of the selected memory cell MC0-0 to which the data is to be written. On the other hand, the potential of the bit line BL1 is transmitted to the channel of the selected memory cell MC1-0 to which no data is written. When the voltage of the channel is Vdd-Vth (Vth is the threshold voltage of a select gate transistor S1-2), the select gate transistor S1-2 is cut off. Then, the voltage Vsgd of the select gate line SGD is reduced. In this way, the channel of a NAND cell unit 4 including the selected memory cell MC1-0 to which no data is written is in a floating state while the voltage Vdd-Vth is maintained.

In this state, a writing voltage Vpp, which is a high voltage, is applied to the selected word line WL0 and a first writing pass voltage Vpass (Vpp>Vpass>Vdd), which is an intermediate voltage, is applied to the non-selected word lines WL3 to WL63 and the dummy word lines DWL1 and DWL2. In this embodiment, a second writing pass voltage Vpass' is applied to the two non-selected word lines WL1 and WL2 adjacent to the side of the selected word line WL0 close to the bit line BL.

As a result, in the selected memory cell MC, which is a writing target, since the channel voltage is 0 V, a high voltage is applied between the floating gate and the channel, the tunnel injection of electrons into the floating gate occurs, and the threshold voltage is positive such that data "0" is written. In the selected memory cell MC to which no data is written and the writing voltage Vpp is applied, since the channel is in a floating state, the potential of the channel is increased by the capacitance coupling between the control gate and the channel of the selected memory cell MC and no electron is injected into the floating gate. In this way, the writing of data "0" is prohibited.

In this embodiment, before the second writing operation is performed on the selected page <i>, the first writing operation is performed on the first adjacent page <i+1> and the second adjacent page <i+2>. Therefore, in some cases, electrons are injected into the floating gate of a memory cell MCi+1 adjacent to a non-selected memory cell MCi and a memory cell MCi+2 adjacent to the memory cell MCi+1. In this case, channel boosting efficiency is likely to be reduced by the electrons injected into the floating gates of the memory cells MCi+1 and MCi+2. However, in the non-volatile semiconductor memory device according to this embodiment, since the second writing voltage Vpass' higher than the first writing pass voltage Vpass is applied to the non-selected word lines WL1 and WL2 adjacent to the side of the selected word line WL0 closer to the bit line BL, it is possible to prevent the reduction in the boosting efficiency.

When the writing voltage Vpp is about 20 V, the first writing pass voltage Vpass is about 8 V. Alternatively, the second writing pass voltage Vpass' is higher than the first writing pass voltage Vpass and is lower than the writing voltage Vpp. For example, the second writing pass voltage Vpass' may be set to about 9 V to 11 V.

During the second writing operation for the selected word line WL0, if the first writing operation for n pages adjacent to the side of the selected word line WL0 close to the bit line is performed, the second writing pass voltage Vpass' may be applied to the corresponding n word lines WL1 to WLn.

Third Embodiment

Next, a non-volatile semiconductor memory device according to a third embodiment will be described. In the second embodiment, the voltage applied to the word line WL is adjusted to solve the problem of the boosting efficiency being reduced. In this embodiment, the voltage applied to the bit line BL is adjusted to solve the problem of the boosting efficiency being reduced.

Figure 6:
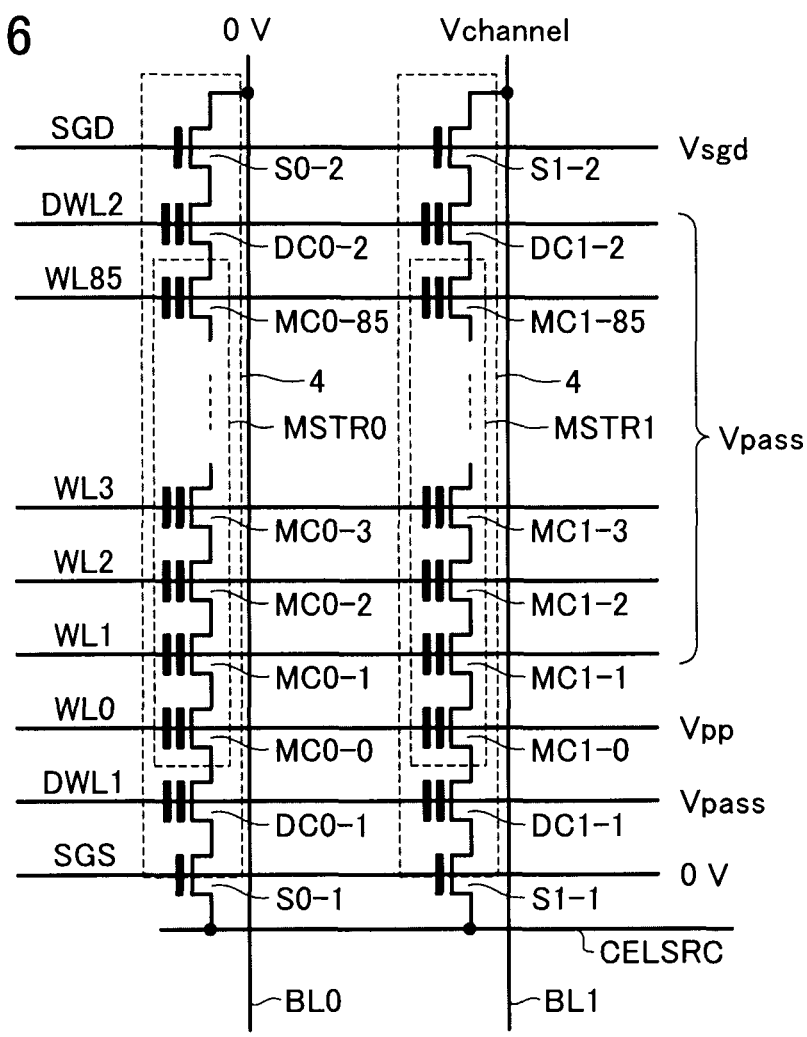
FIG. 6 is a circuit diagram illustrating a voltage applying method when a second writing operation is performed in a non-volatile semiconductor memory device according to a third embodiment.

That is, as shown in FIG. 6, in this embodiment, during a writing operation, a channel voltage Vchannel higher than a power supply voltage Vdd is applied to a bit line BL1 including a memory cell MC1-0 to which no data is written and adjacent memory cells MC1-1 and MC1-2 on which LM writing is performed. For example, it is considered that the channel voltage Vchannel is set to about 3 V to 12 V and preferably about 3 V to 5 V. In this case, even when the voltage applied to the bit line BL1 increases, it is possible to exclude an influence on the memory cells MC1-1 and MC1-2 adjacent to the side of the selected memory cell MC1-0 close to the bit line BL1 by LM writing.

For example, this method can be implemented as follows. That is, during the second writing operation, a high voltage generating circuit 8 generates the channel voltage Vchannel and supplies the generated channel voltage Vchannel to a column decoder 2b. The column decoder 2b applies the channel voltage Vchannel to a non-selected bit line BL1 when LM writing is performed on at least one memory cell MC with reference to written data read from the memory cells MC1-1 and MC1-2 or the writing information of LM data stored in a peripheral circuit, such as a sense amplifier (not shown). In addition, the channel voltage Vchannel may increase according to the number of LM writing operations for the memory cells MC1-1 and MC1-2.

In this embodiment, similarly to the second embodiment, it is possible to prevent boosting efficiency from being reduced.

In the above-described first to third embodiments, after the first writing operation for the first adjacent memory cell MCi+1 and the second adjacent memory cell MCi+2 is finished, the second writing operation is performed on the selected memory cell MCi. However, the second writing operation may be performed on the selected memory cell MCi after the first writing operation on a memory cell MCi+3 adjacent to the second adjacent memory cell MCi+2. That is, before the second writing operation is performed on the selected memory cell MCi, only the first writing operation for the first adjacent memory cell MCi+1 and the second adjacent memory cell MCi+2 need to be finished, and the first writing operation may be performed on n (n is equal to or greater than 2) memory cells MC in advance. In addition, the second embodiment and the third embodiment may be combined with each other.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a plurality of cell units including first and second select gate transistors and a memory string that is provided between the first and second select gate transistors and includes a plurality of memory cells which store electrically-rewritable data and are connected in series to each other; and
   a data writing unit that sequentially writes lower page data and upper page data corresponding to the lower page data to a selected memory cell selected in order from one close to the first select gate transistor to one close to the second select gate transistor, and performs a first writing operation of writing the lower page data to the selected memory cell and a second writing operation of writing the upper page data to the selected memory cell after the first writing operation for n (n is an integer equal to or greater than 2) non-selected memory cells which are adjacent to a side of the selected memory cell close to the second select gate transistor.

2. The non-volatile semiconductor memory device according to claim 1, further comprising:
   a bit line that is connected to the cell unit through the second select gate transistor; and
   a word line that is commonly connected to control gates of corresponding memory cells in the cell units,
   wherein the data writing unit applies a writing voltage to a selected word line connected to the selected memory cell and applies a writing pass voltage to non-selected word lines connected to the non-selected memory cells when the second writing operation is performed on the selected memory cell, and
   the writing pass voltage applied to n non-selected word lines which are adjacent to a side of the selected word line close to the second select gate transistor is greater than that applied to the other non-selected word lines.

3. The non-volatile semiconductor memory device according to claim 1, further comprising:
   a bit line that is connected to the cell unit through the second select gate transistor; and
   a word line that is commonly connected to control gates of corresponding memory cells in the cell units,
   wherein, when the second writing operation is performed on the selected memory cell, the data writing unit applies to the bit line a voltage greater than a voltage applied to the other bit lines, the bit line being connected to the selected memory cell to which no data is written and the bit line being connected to the n non-selected memory cells adjacent to the side of the selected memory cell close to the second select gate transistor to which the lower page data other than an erasing level is written.

4. The non-volatile semiconductor memory device according to claim 1, further comprising:
   a bit lines that is connected to the cell unit through the second select gate transistor;
   a word line that is commonly connected to control gates of corresponding memory cells in the cell units;
   a first dummy cell connected between the memory string and the first select gate transistor and a second dummy cell connected between the memory string and the second select gate transistor, the first dummy cell and the second dummy cell have the same structure as the memory cell; and first and second dummy word lines that are commonly connected to control gates of the first and second dummy cells.

5. The non-volatile semiconductor memory device according to claim 1, further comprising:

a bit line that is connected to the cell unit through the second select gate transistor; and a word line that is commonly connected to control gates of corresponding memory cells in the cell units, wherein the data writing unit applies a channel boosting voltage to the bit line connected to the selected memory cell to which no data is written, applies a writing voltage to a selected word line connected to the selected memory cell and applies a writing pass voltage to non-selected memory cells adjacent to the selected memory cells to cut off the non-selected memory cells.

6. The non-volatile semiconductor memory device according to claim 3, wherein the voltage applied to the bit line increases according to the number of non-selected memory cells to which the lower page data other than the erasing level is written, among the n non-selected memory cells which are adjacent to the side of the selected memory cell close to the second select gate transistor.

7. The non-volatile semiconductor memory device according to claim 2, further comprising:

a first dummy cell connected between the memory string and the first select gate transistor and a second dummy cell connected between the memory string and the second select gate transistor, the first dummy cell and the second dummy cell have the same structure as the memory cell; and first and second dummy word lines that are commonly connected to control gates of the first and second dummy cells.

8. The non-volatile semiconductor memory device according to claim 5, further comprising:

a first dummy cell connected between the memory string and the first select gate transistor and a second dummy cell connected between the memory string and the second select gate transistor, the first dummy cell and the second dummy cell have the same structure as the memory cell; and first and second dummy word lines that are commonly connected to control gates of the first and second dummy cells.

9. A method of writing data in a non-volatile semiconductor memory device including a plurality of cell units including first and second select gate transistors and a memory string that is provided between the first and second select gate transistors and includes a plurality of memory cells which store electrically-rewritable data and are connected in series to each other, and a data writing unit that sequentially writes lower page data and upper page data corresponding to the lower page data to the memory cells, the method comprising:

performing a first writing operation of writing the lower page data to a selected memory cell; and performing a second writing operation of writing the upper page data to the selected memory cell after the first writing operation for n (n is an integer equal to or greater than 2) non-selected memory cells which are adjacent to a side of the selected memory cell close to the second select gate transistor.

10. The method of writing data in a non-volatile semiconductor memory device according to claim 9, wherein the non-volatile semiconductor memory device further includes:

a bit line that is connected to the cell unit through the second select gate transistor; and a word line that is commonly connected to control gates of corresponding memory cells in the cell units, when the second writing operation is performed on the selected memory cell, a writing voltage is applied to a selected word line connected to the selected memory cell and a writing pass voltage is applied to non-selected word lines connected to the non-selected memory cells, and the writing pass voltage applied to n non-selected word lines which are adjacent to a side of the selected word line close to the second select gate transistor is greater than that applied to the other non-selected word lines.

11. The method of writing data in a non-volatile semiconductor memory device according to claim 9, wherein the non-volatile semiconductor memory device further includes:

a bit line that is connected to the cell unit through the second select gate transistor; and a word line that is commonly connected to control gates of corresponding memory cells in the cell units, when the second writing operation is performed on the selected memory cell, a voltage is applied to the bit line, the voltage being greater than a voltage applied to the other bit lines, connected to the selected memory cell to which no data is written and connected to the n non-selected memory cells adjacent to the side of the selected memory cell close to the second select gate transistor to which the lower page data other than an erasing level is written.

12. The method of writing data in a non-volatile semiconductor memory device according to claim 9, wherein the non-volatile semiconductor memory device further includes:

a bit line that is connected to the cell unit through the second select gate transistor; and a word line that is commonly connected to control gates of corresponding memory cells in the cell units, wherein, when the second writing operation is performed on the selected memory cell, a channel boosting voltage is applied to the bit line connected to the selected memory cell to which no data is written, a writing voltage is applied to a selected word line connected to the selected memory cells and a writing pass voltage is applied to non-selected memory cells adjacent to the selected memory cells to cut off the non-selected memory cells.

13. The method of writing data in a non-volatile semiconductor memory device according to claim 11, wherein the voltage applied to the bit line increases according to the number of non-selected memory cells to which the lower page data other than the erasing level is written, among the n non-selected memory cells which are adjacent to the side of the selected memory cell close to the second select gate transistor.

14. The method of writing data in a non-volatile semiconductor memory device according to claim 10, wherein the non-volatile semiconductor memory device further includes:

a first dummy cell connected between the memory string and the first select gate transistor and a second dummy cell connected between the memory string and the second select gate transistor the first dummy cell and the second dummy cell have the same structure as the memory cell; and first and second dummy word lines that are commonly connected to control gates of the first and second dummy cells.

15. The method of writing data in a non-volatile semiconductor memory device according to claim 12,
wherein the non-volatile semiconductor memory device further includes:
a first dummy cell connected between the memory string and the first select gate transistor and a second dummy cell connected between the memory string and the second select gate transistor, the first dummy cell and the second dummy cell have the same structure as the memory cell; and
first and second dummy word lines that are commonly connected to control gates of the first and second dummy cells.

16. A non-volatile semiconductor memory device comprising:
a plurality of cell units including first and second select gate transistors and a memory string that is provided between the first and second select gate transistors and includes a plurality of memory cells which store electrically-rewritable data and are connected in series to each other;
a bit line that is connected to the cell unit through the second select gate transistor;
a word line that is commonly connected to control gates of corresponding memory cells in the cell units; and
a data writing unit that alternately performs a first writing operation of writing lower page data to a page <i+n> including the memory cells which are connected to an (i+n)-th word line (i is a natural number and is a variable, and n is a natural number and is an integer equal to or greater than 2) from the word line closest to the first select gate transistor to the second select gate transistor, and a second writing operation of writing upper data page to a page <i> including the memory cells which are connected to an (i)-th word line from the word line closest to the first select gate transistor to the second select gate transistor.

17. The non-volatile semiconductor memory device according to claim 16,
wherein the data writing unit applies a writing voltage to a selected word line connected to the selected memory cells and applies a writing pass voltage to non-selected word lines connected to the non-selected memory cells when the second writing operation is performed on the selected memory cells, and
the writing pass voltage applied to n non-selected word lines which are adjacent to a side of the selected word line close to the second select gate transistor is greater than that applied to the other non-selected word lines.

18. The non-volatile semiconductor memory device according to claim 16,
wherein, when the second writing operation is performed on the selected memory cell, a voltage is applied to the bit line, the voltage being greater than a voltage applied to the other bit lines, connected to the selected memory cell to which no data is written and connected to n non-selected memory cells adjacent to a side of the selected memory cell close to the second select gate transistor to which the lower page data other than an erasing level is written.

19. The non-volatile semiconductor memory device according to claim 16, further comprising:
a first dummy cell connected between the memory string and the first select gate transistor and a second dummy cell connected between the memory string and the second select gate transistor, the first dummy cell and the second dummy cell have the same structure as the memory cell; and
first and second dummy word lines that are commonly connected to control gates of the first and second dummy cells.

20. The non-volatile semiconductor memory device according to claim 16,
wherein the data writing unit applies a channel boosting voltage to the bit line connected to the selected memory cell to which no data is written, applies a writing voltage to a selected word line connected to the selected memory cells and applies a writing pass voltage to non-selected memory cells adjacent to the selected memory cells to cut off the non-selected memory cells.

* * * * *